US008659972B2

(12) United States Patent
Phan et al.

(10) Patent No.: US 8,659,972 B2
(45) Date of Patent: Feb. 25, 2014

(54) ADAPTIVE READ WORDLINE VOLTAGE BOOSTING APPARATUS AND METHOD FOR MULTI-PORT SRAM

(75) Inventors: Michael ThaiThanh Phan, Cary, NC (US); Manish Garg, Morrisville, NC (US); David Paul Hoff, Raleigh, NC (US); Quan Nguyen, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 7 days.

(21) Appl. No.: 13/543,916

(22) Filed: Jul. 9, 2012

(65) Prior Publication Data

US 2013/0064031 A1 Mar. 14, 2013

Related U.S. Application Data

(60) Provisional application No. 61/533,647, filed on Sep. 12, 2011.

(51) Int. Cl.
*G11C 5/14* (2006.01)

(52) U.S. Cl.
USPC ......... 365/226; 365/228; 365/194; 365/233.1

(58) Field of Classification Search
USPC ............................... 365/226, 228, 194, 233.1
See application file for complete search history.

(56) References Cited

U.S. PATENT DOCUMENTS 7,417,482 B2 * 8/2008 Elgebaly et al. .............. 327/278
7,934,181 B2 4/2011 Hanafi et al.
7,969,220 B2 * 6/2011 Ahn et al. ..................... 327/261
8,010,935 B2 * 8/2011 Tetelbaum et al. ........... 716/138
8,270,247 B2 * 9/2012 Sasaki ....................... 365/230.06
8,339,884 B2 * 12/2012 Huang et al. .................. 365/203
8,350,589 B2 * 1/2013 Chlipala et al. ................. 326/16
2010/0277990 A1 11/2010 Kenkare et al.
2011/0063932 A1 3/2011 Chandra et al.
2011/0158029 A1 6/2011 Sasaki
2012/0218005 A1 * 8/2012 Chua-Eoan et al. .......... 327/107

FOREIGN PATENT DOCUMENTS

EP 0862181 A2 9/1998

OTHER PUBLICATIONS

Nii, et al., “A 45-nm Single-Port and Dual-Port SRAM Family with Robust Read/Write Stabilizing Circuitry under DVFS Environment,” 2008 IEEE Symposium on VLSI Circuits, Jun. 2008, pp. 212-213.
O’Uchi, et al., “0.5V FinFET SRAM with Dynamic Threshold Control of Pass Gates for Salvaging Malfunctioned Bits,” 2010 Proceedings of the ESSCIRC, IEEE, Sep. 2010, pp. 474-477.
Sasan, et al., “Process Variation Aware SRAM/Cache for Aggressive Voltage-Frequency Scaling,” Automation & Test in Europe Conference & Exhibition, 2009, pp. 911-916.
International Search Report and Written Opinion—PCT/US2012/054907—ISA/EPO—Jan. 11, 2013.

* cited by examiner

*Primary Examiner* — Viet Q Nguyen
(74) *Attorney, Agent, or Firm* — Nicholas J. Pauley; Peter Michael Kamarchik; Joseph Agusta

(57) ABSTRACT

Embodiments of the invention are directed to systems and methods for adaptively boosting the supply voltage to an SRAM (Static Random Access Memory) in response to process-voltage-temperature variations when needed. Embodiments include a critical path that simulates a typical memory cell and read-out circuit in the SRAM. Applying a trigger signal to a word-line input port of the critical path, and comparing the output of the critical path to a reference-latch signal, provides an indication of when to boost the supply voltage to the read-out circuits of the SRAM.

28 Claims, 6 Drawing Sheets

602
604C
604B
604A
608
610
606

ADAPTIVE READ WORDLINE VOLTAGE BOOSTING APPARATUS AND METHOD FOR MULTI-PORT SRAM

CLAIM OF PRIORITY UNDER 35 U.S.C. §119

The present Application for Patent claims priority to Provisional Application No. 61/533,647 entitled APPARATUS FOR ADAPTIVE READ WORD-LINE BOOSTING WITHIN A MULTI-PORT SRAM filed 12 Sep. 2011, and assigned to the assignee hereof and hereby expressly incorporated by reference herein.

FIELD OF DISCLOSURE

The present invention relates to electronic circuits, and more particularly to static random access memory.

BACKGROUND

Static Random Access Memory (SRAM) is a common type of its non-volatility, low power dissipation, and applicability to high-speed operations.

One example of an SRAM memory cell is illustrated in FIG. 5. It is the so-called eight-transistor (8T) SRAM cell, where the eight transistors in a cell are labeled M1 through M8. In FIG. 5, the write word-line is labeled WWL, the write bit-line and its complement are labeled WBL and WBL#, respectively, the read word-line is labeled RWL, and the read bit-line is labeled RBL.

Operation of the SRAM cell illustrated in FIG. 5 is well known and need not be described in detail; however, it is pedagogically useful to discuss some features of the cell so as to motivate the embodiments described later.

As is well known, transistors M1 through M4 comprised two cross coupled inverters to store the state of the memory cell. Pass transistors M5 and M6 allow the state of the memory cell to be changed during a write operation, and pass transistor M7 and pull-down transistor M8 allow the state of the memory cell to be sensed during a read operation. Before a read operation is performed, the read bit-line RBL is pre-charged to the supply voltage Vdd, and when the supply voltage is provided to the read word-line RWL to perform a read, the read bit-line RBL is either pulled down to the substrate voltage Vss or kept at the supply voltage Vdd, depending upon the state of the memory cell.

A so-called weak bit is a memory cell that has relatively low current capacity compared to an ideal memory cell. This degradation is usually due to process-voltage-temperature (PVT) device variations. The cell-read-current of a weak bit may affect and degrade the performance of an SRAM cache memory, for example. Also, a weak bit has higher voltage sensitivity due to a higher threshold voltage, which may result in performance degradation more severe than that due to supply voltage noise.

Process variation also limits the minimum write voltage (Vmin) of an 8T cell, and this sets the overall minimum operation voltage for single rail processor circuits that employ SRAM cache. Mobile processors may be required to perform to an aggressive power specification; therefore, lowering the 8T cell $V_{min}$ is important.

SUMMARY

Embodiments of the invention are directed to systems and methods for boosting the supply voltage to an SRAM adaptively in response to process-voltage-temperature variations when needed.

In one embodiment, a voltage boost generator boosts a supply voltage to a memory cell. The embodiment includes a control circuit to provide a trigger signal and a reference-latch signal in response to a clock signal. The reference-latch signal is delayed relative to the trigger signal. A delay circuit is coupled to the control circuit to delay the trigger signal. An array of memory cells having a word-line input port coupled to the delay circuit receives the delayed trigger signal. The array of memory cells provides a set of read bit-line signals in response to the delayed trigger signal. The set of read bit-line signals is provided to a latch, where the latch is controlled by the reference-latch signal. The output of the latch signals to the voltage boost generator when to boost the supply voltage provided to the memory cell.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
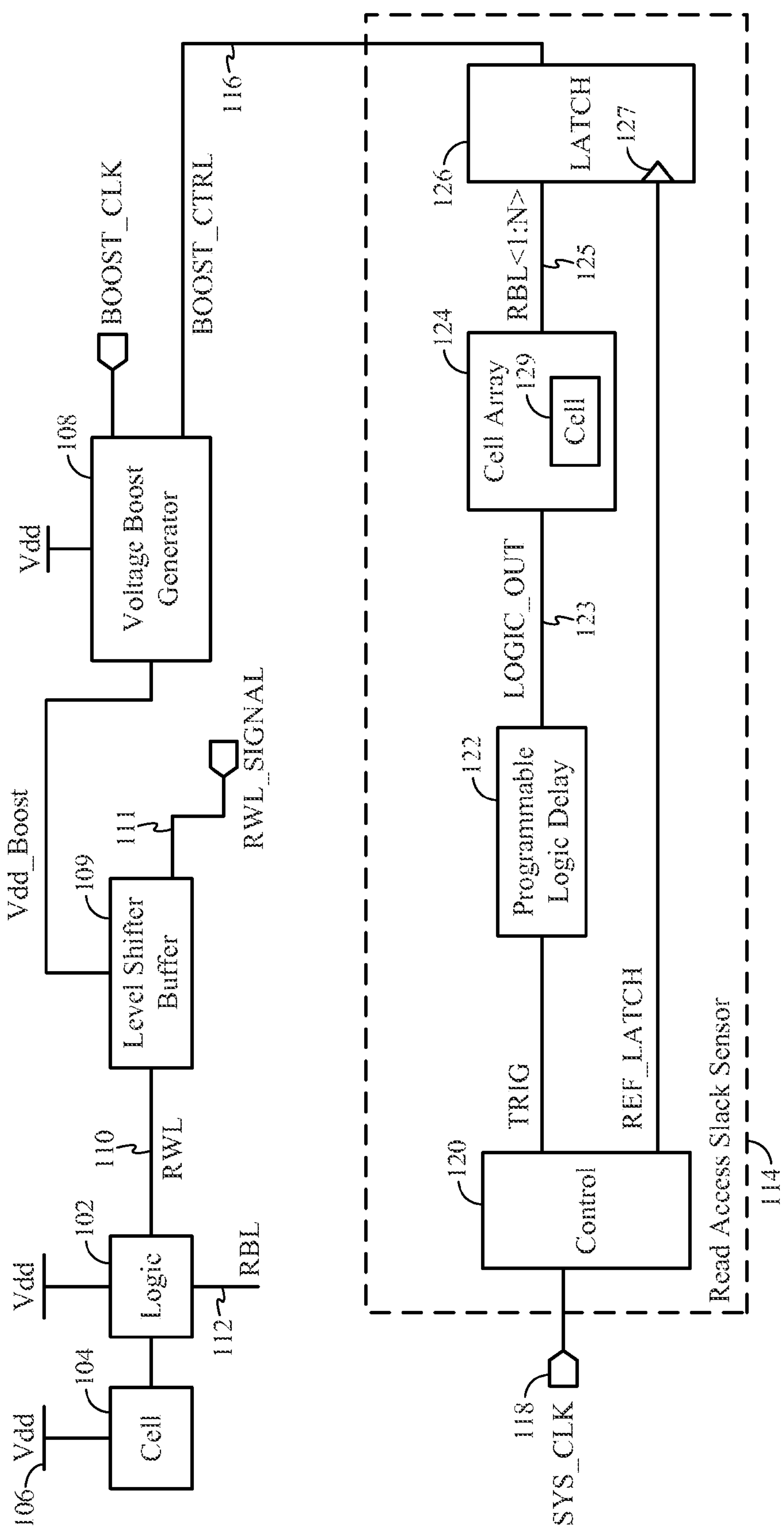
FIG. 1 is a high-level representation of a circuit according to an embodiment.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. it will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. Specific circuits (e.g., application specific integrated circuits (ASICs)), program instructions being executed by one or more processors, or a combination of both, may perform the various actions described herein. Additionally, the sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In a mobile processor with SRAM that includes 8T memory cells, with separate read and write ports, the cell-write minimum voltage Vmin and cell-read-current may be improved by boosting a word-line (WL) voltage. A word-line voltage is meant to encompass a read word-line voltage or a write word-line voltage. By raising the WL voltage, a write margin and a cell-read-current of a weak bit cell may be significantly improved.

However, there may be an area and power cost associated with implementing a voltage-boosting scheme. Furthermore, there may be an increased reliability risk associated with operating at a voltage higher than the nominal voltage allowed by the process technology. To mitigate this cost and reliability risk, embodiments adaptively boost the WL voltage in response to PVT variations when needed.

FIG. 1 illustrates an embodiment to provide a boosted supply voltage, denoted as Vdd_BOOST, to the read-logic associated with one or more memory cells. In FIG. 1, the read-logic is labeled 102 and a typical memory cell is labeled 104. Rail 106 provides the supply voltage Vdd. The boosted voltage, Vdd_BOOST, is equal to or greater than the supply voltage Vdd, and is provided by the voltage boost generator 108.

The voltage Vdd_BOOST is provided to the level shifter buffer 109. The input port 111 to the level shifter buffer 109 receives the read word-line signal, denoted as RWL_SIGNAL in FIG. 1. When RWL_SIGNAL is asserted, it is brought from Vss to the voltage Vdd. The output port of the level shifter buffer 109 is connected to the read word-line (RWL) 110 of the read-logic 102. The level shifter buffer 109 shifts the voltage applied to its input port 111 so that when the RWL_SIGNAL is asserted to begin a read operation, the voltage Vdd_BOOST is provided to one or more transistor gates in the read-logic 102. During a read operation, the read bit-line (RBL) 112 provides a voltage indicative of the state of the memory cell 104.

For example, for an SRAM cell, RBL 112 is pre-charged to the supply voltage Vdd before performing a read operation. When reading the memory cell, the state of the memory cell and the read-logic cause RBL 112 to either be pulled low to the substrate voltage Vss or kept at the supply voltage Vdd, depending upon the state of the memory cell. Here, "state" refers to the one bit of information stored in the memory cell.

Figure 5:
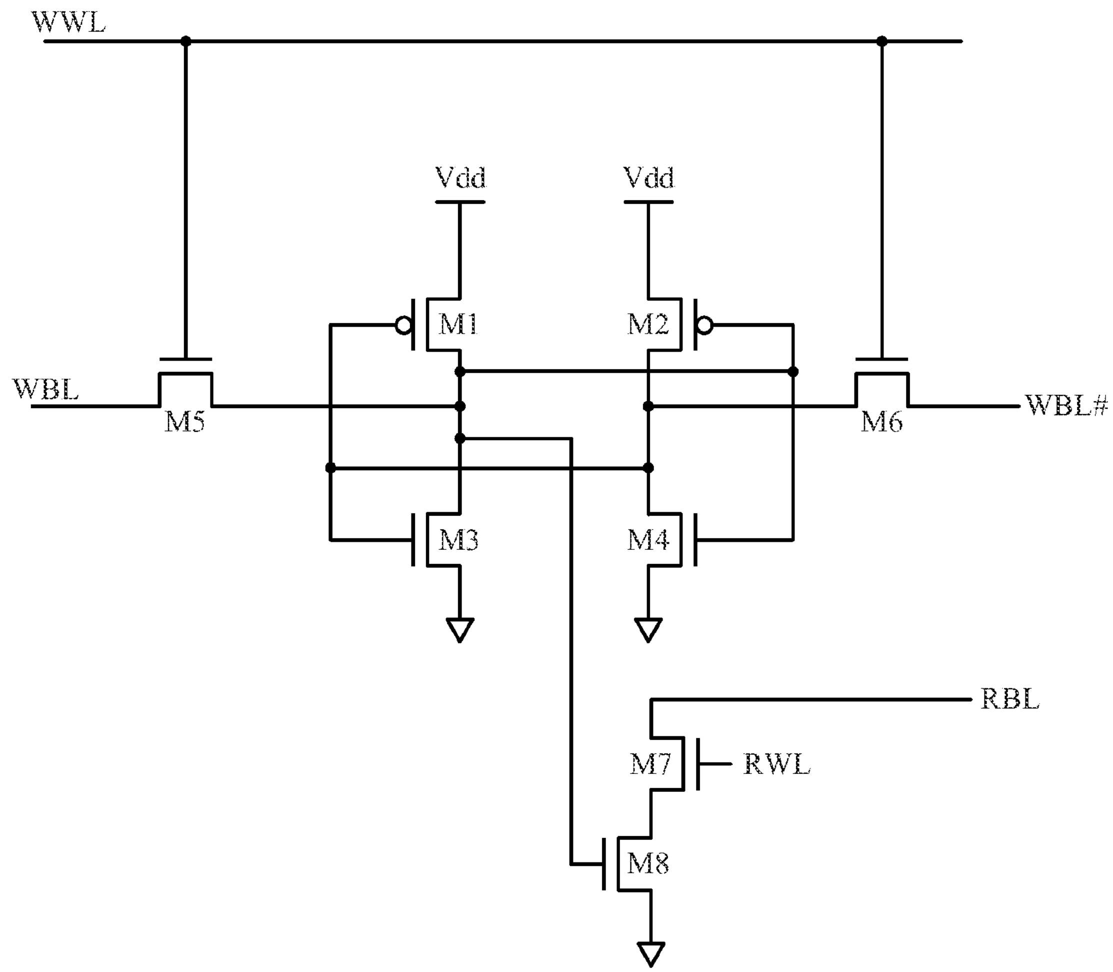
FIG. 5 illustrates an 8-transistor memory cell that may be used in the embodiment of FIG. 1.

The combination of the memory cell 104 and the read-logic 102 may be viewed as an abstraction of the 8T SRAM cell described in FIG. 5. However, embodiments are not limited to SRAM memory cells. Continuing with the example in which a boosted voltage is applied to an 8T SRAM memory cell, the word-line voltage that is boosted may be RWL 110, as for the example of FIG. 5, or the WWL line of FIG. 5 (not shown in FIG. 1 for ease of illustration).

The circuit blocks illustrated within dashed line 114 comprise a circuit for sensing when a boosted voltage should be applied to a word-line to mitigate the previously described degradation issues due to PVT variations. Such a circuit may be termed a Read Access Slack Sensor (RASS), and is referred to as RASS 114. RASS 114 provides a control signal BOOST_CTRL on output port 116 to the voltage boost generator 108. The control signal BOOST_CTRL signals when the voltage signal Vdd_BOOST should be greater than the supply voltage Vdd.

A clock signal (generated by a system clock), denote as SYS_CLK in FIG. 1, is provided to the input port 118 of the control functional unit 120. In response to the clock signal, the control functional unit 120 provides a trigger signal TRIG and a reference-latch signal REF_LATCH. The control functional unit 120 asserts the trigger signal and the reference-latch signal for some particular length of time, where the reference-latch signal REF_LATCH lags the trigger signal TRIG. For some embodiments, the control functional unit 120 asserts the trigger signal TRIG on every other rising edge of the clock signal SYS_CLK, and asserts the reference-latch signal REF LATCH on the rising edges of the clock signal SYS_CLK immediately following the rising edges when the trigger signal TRIG is asserted. In such a particular example, the reference-latch signal REF_LATCH lags the trigger signal TRIG by one clock period. However, other embodiments may be such that the time lag between the trigger signal TRIG and the reference-latch REF_LATCH signal is less than one clock period.

The trigger signal TRIG is applied to a programmable logic delay 122. The programmable logic delay 122 models the read access path associated with the read-logic 102 of the memory cells, for example the read-logic of the 8T SRAM memory cell of FIG. 5 (transistors M7 and M8), and other stack and non-stack logic gates along the periphery of the memory cells.

In the embodiment illustrated in FIG. 1, the programmable logic delay 122 is designed to be programmable for flexibility. However for some embodiments, a non-programmable delay circuit may be employed instead of the programmable logic delay 122.

The output signal provided by the programmable logic delay 122 is denoted as LOGIC_OUT in FIG. 1. This output signal is a logic signal which is in some sense a delayed version of the trigger signal TRIG and mimics the signal delay for the read-logic associated with the SRAM memory cells due to PVT variations.

The LOGIC_OUT signal is provided to the word-line input port 123 of the memory cell array 124. A word-line input port may be a read word-line port or a write word-line port. The memory cell array 124 comprises a plurality of memory cells arranged in a combination of parallel and series connected 8T SRAM memory cells, each having the same layout as the memory cell 104 including read-logic 102. The memory cell 129 is shown within the memory cell array 124 to indicate that the memory cells within the memory cell array 124 have the same layout as the memory cell 104 and read-logic 102. The combination of parallel and series connected memory cells simulate a delay that tracks mean read-delay across various PVT conditions and is set equal to the expected weak bit delay of the system.

The output of the memory cell array 124 comprises one or more signals that mimic the RBL, signal of the memory cells in the system memory SRAM. These signals are denoted as RBL<1:N> in FIG. 1, indicating that there are N signals. The signals are provided to the latch 126 at the latch input ports 125. The latch 126 is clocked by the reference-latch signal REF_LATCH at the reference-latch input port 127. If it least one of the signals represented by RBL<1:N> is a logic HIGH when REF_LATCH is a logic HIGH, then the output of the latch 126, denoted as BOOST_CTRL, is pulled to a logic HIHG. This causes the voltage boost generator 108 to boost the voltage Vdd_BOOST above the supply voltage Vdd.

The combination of the programmable logic delay 122 and the memory cell array 124 provides a critical path delay. This critical path delay mimics the critical path delay of a typical memory cell and read-logic within the system memory SRAM due to PVT variations. For the particular embodiment of FIG. 1 in which the trigger signal and the reference-latch signal differ by one clock period, the BOOST_CTRL signal is pulled to a logic HIGH when the delay experienced by the trigger signal due to the critical path delay is equal to or greater than one clock period. Such a critical path delay is indicative that the memory cells in the system memory SRAM have degraded performance. By boosting the voltage applied to the word-lines under this condition, it is expected that embodiments will mitigate performance degradation of reading and writing to memory cells due to PVT variations.

Figure 2:
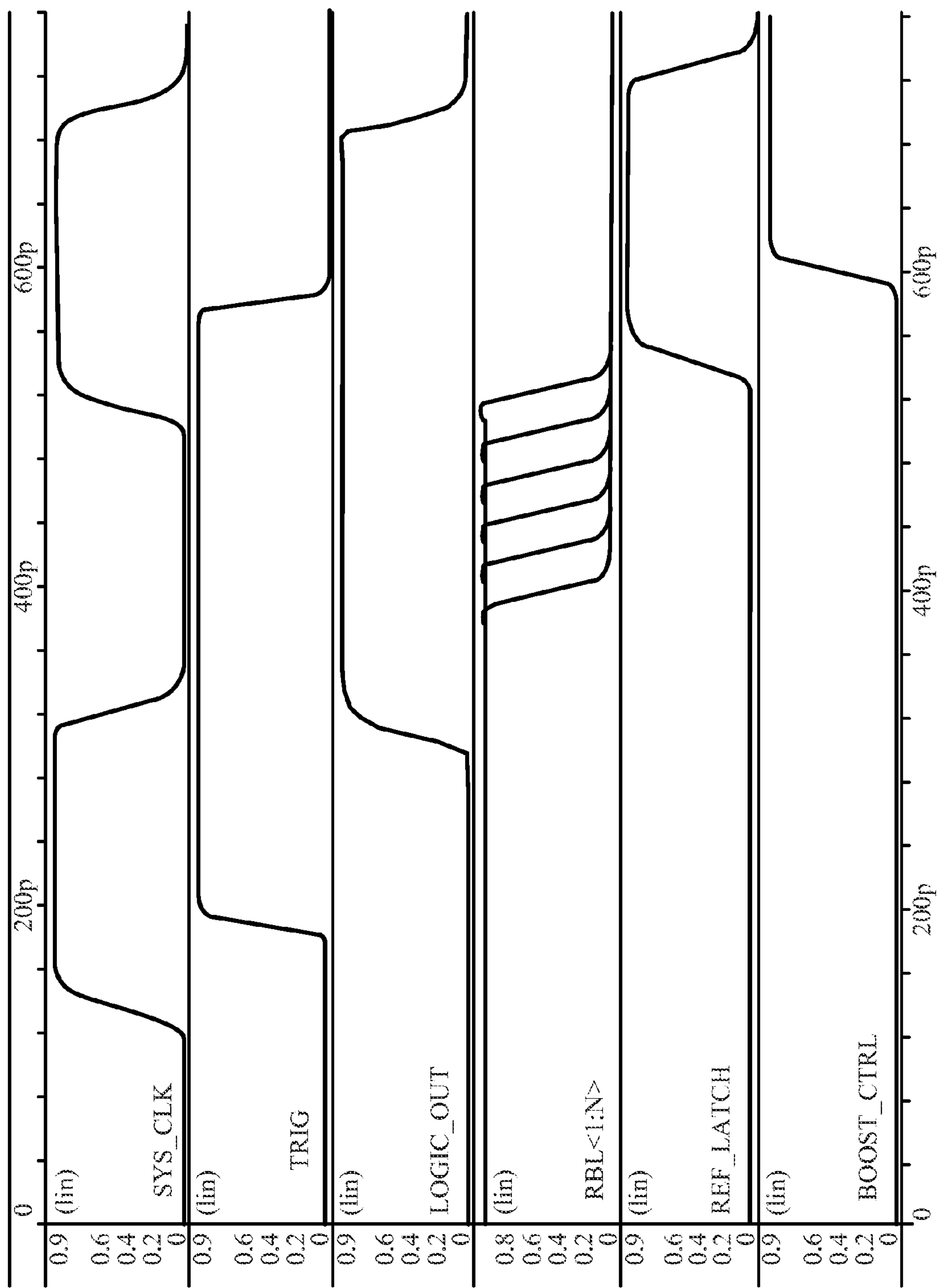
FIG. 2 illustrates waveforms at various ports in the circuit of FIG. 1.

FIG. 2 illustrates waveforms for the various signals related to RASS 114. The signals SYS_CLK, TRIG, LOGIC_OUT, RBL<1:N>, REF_LATCH, and BOOST_CTRL are indicated next to their respective waveforms in FIG. 2. Note that in the particular embodiment represented by FIG. 2, the trigger signal TRIG is asserted shortly after the rising edge of the clock signal SYS_CLK. The delay between the trigger signal TRIG and the logic signal LOGIC_OUT is the delay introduced by the programmable logic delay 122. The various delays between the logic signal LOGIC_OUT and the various signals making up RBL<1:N> (with N=6 in the example) are the delays introduced by the memory cell array 124.

In the particular embodiment illustrated in FIG. 2, the control functional unit 120 delays the reference-latch signal REF_LATCH one clock period relative to the trigger signal TRIG. Because the last waveform in RBL<1:N> has not yet completely fallen as the reference-latch signal REF_LATCH starts to rise, the latch 126 pulls the control signal BOOST_CTRL to a logic HIGH as shown for the BOOST_CTRL waveform in FIG. 2. With this signal pulled high, the RASS 114 signals to the voltage boost generator 108 to boost the voltage Vdd_BOOST higher than the supply voltage Vdd, as discussed previously.

Figure 3:
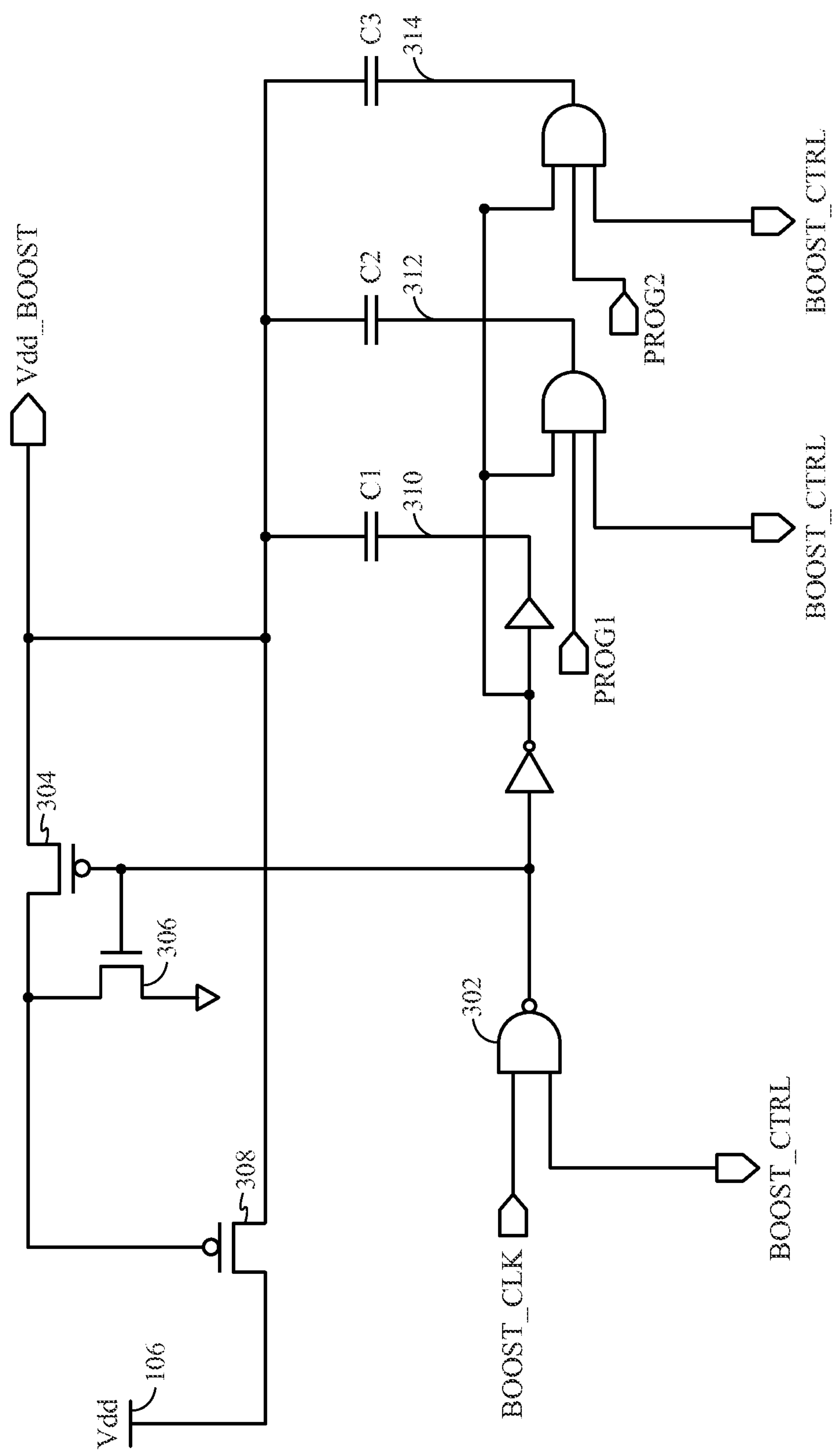
FIG. 3 is an example of a voltage boost generator that may be used in the embodiment of FIG. 1.

Many circuits are well known to those of ordinary skill in the art of circuit design for boosting a supply voltage, and such circuits may be used for the voltage boost generator 108 in an embodiment. FIG. 3 provides an example of a circuit to implement the functionality of the voltage boost generator 108.

Referring to FIG. 3, the control signal BOOST_CTRL is provided to one of the input ports of NAND gate 302, and a boost clock signal BOOST_CLK is provided to the other input port of NAND gate 302. The boost clock signal BOOST_CLK can be set to go to a logical HIGH only when the read bit-line RBL 112 is being pulled to the substrate voltage Vss during a read operation. In this way, the voltage Vdd_BOOST will be boosted above the supply voltage Vdd only when the read bit-line is being pulled to a logical LOW (Vss). This helps ensure read-data integrity.

When at least one of the signals BOOST_CLK and BOOST_CTRL is a logical LOW (Vss), pass transistor 304 is OFF and pull-down transistor 306 is ON so that pass transistor 308 is ON. This sets the voltage signal Vdd_BOOST to the supply voltage Vdd and charges capacitors C1, C2, and C3 to Vdd.

When the control signal BOOST_CTRL is pulled to a logical HIGH when the boost clock signal BOOST_CLK is also at a logical HIGH, pass transistor 304 is ON and pull-down transistor 306 is OFF, which in turn keeps pass transistor 308 OFF. This isolates the supply voltage rail 106 from the output port labeled the voltage signal Vdd_BOOST. Also, the terminal 310 of capacitor C1 is brought to a logical HIGH, which boosts the voltage at the output port supplying the voltage Vdd_BOOST.

Furthermore, with both BOOST_CTRL and BOOST_CLK at a logical HIGH voltage, if the signal PROG1 is set to a logical HIGH, then the terminal 312 of capacitor C2 is brought to a logical HIGH, which also boosts the voltage at the output port supplying the voltage Vdd_BOOST. Similarly, if the signal PROG2 is set to a logical HIGH, then the terminal 314 of capacitor C3 is brought to a logical HIGH, which also boosts the voltage at the output port supplying the voltage Vdd_BOOST.

It is seen that the programming signals PROG1 and PROG2 determine whether the capacitors C2 and C3 are also boosting the voltage Vdd_BOOST. In this way, these programming signals can be used to adjust how much the supply voltage is boosted. Adding additional capacitors and associated circuit components with additional programming signals will lead to a higher boost for the supply voltage.

Figure 4:
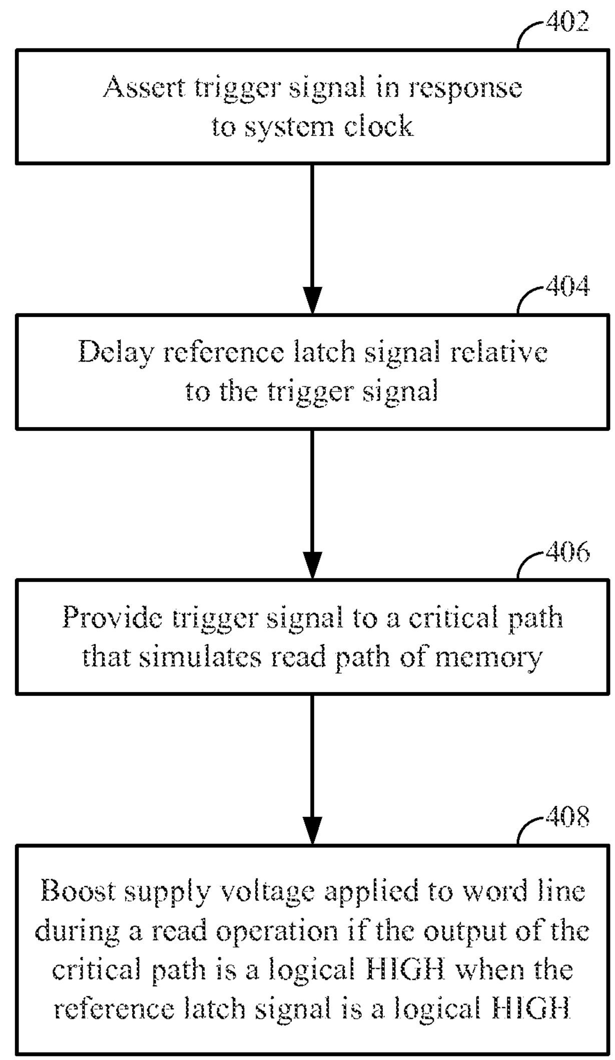
FIG. 4 illustrates a method according to an embodiment.

FIG. 4 illustrates a flow diagram according to an embodiment. The functional block 402 asserts a trigger signal in response to a clock signal, and the functional block 404 delays a reference-latch signal relative to the trigger signal. For some embodiments, this delay is equal to one clock period. The functional block 406 provides the trigger signal to a critical path. The critical path simulates the read path of system memory. The functional block 408 boosts the supply voltage that is applied to a word-line during a read operation, provided the output of the critical path is at a logical HIGH when the reference-latch signal is at a logical HIGH.

The functional block 408 can be generalized as follows. The condition where the output of the critical path and the reference-latch signal are both at a logical HIGH may be replaced with the condition that these signals satisfy a logical relationship indicative of a read operation taking longer then some specified period of time, where for the particular embodiment of FIG. 4 the specified period of time is equal to one clock period.

Figure 6:
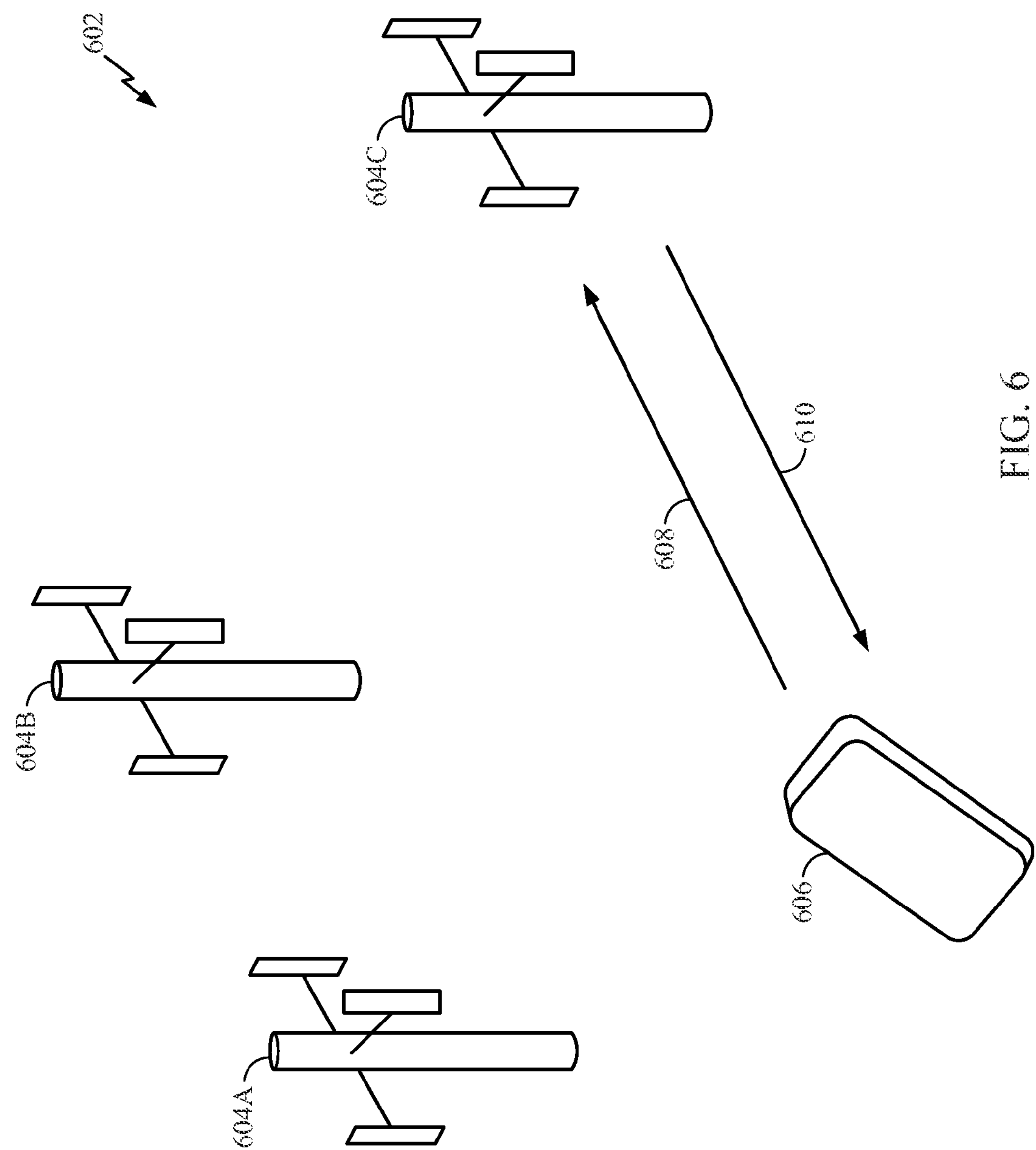
FIG. 6 illustrates a cellular phone network in which an embodiment may find application.

Embodiments may find widespread application in numerous systems, such as a cellular phone network. For example, FIG. 6 illustrates cellular phone network 602 comprising Base Stations 604A, 604B, and 604C. FIG. 6 shows a communication device, labeled 606, which may be a mobile cellular communication device such as a so-called smart phone, a tablet, or some other kind of communication device suitable for a cellular phone network. Communication Device 606 need not be mobile. In the particular example of FIG. 6, Communication Device 606 is located within the cell associated with Base Station 604C, Arrows 608 and 610 pictorially represent the uplink channel and the downlink channel, respectively, by which Communication Device 606 communicates with Base Station 604C.

Embodiments may be used in data processing systems associated with Communication Device 606, or with Base Station 604C, or both, for example. FIG. 6 illustrates only one application among many in which the embodiments described herein may be employed.

Those of skill in the art will appreciate that information and signals may be represented using any of a variety of different technologies and techniques. For example, data., instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art, will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for adaptively boosting the voltage of a word-line during a memory read operation. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising:
- a rail having a supply voltage;
- a memory cell coupled to the rail;
- a voltage boost generator to generate a boosted supply voltage provided to the memory cell;
- a control circuit to provide a trigger signal and a reference-latch signal in response to a clock signal, wherein the reference-latch signal is delayed relative to the trigger signal;
- a delay circuit coupled to the control circuit to delay the trigger signal;
- an array of memory cells having a word-line input port coupled to the delay circuit to receive the delayed trigger signal, the array of memory cells to provide a set of read bit-line signals in response to the delayed trigger signal;
- a latch comprising a reference-latch input port to receive the reference-latch signal, a set of latch input ports to receive the set of read bit-line signals, and an output port to signal to the voltage boost generator when the boosted supply voltage is to be greater than the supply voltage.

2. The apparatus as claimed in claim 1, wherein the delay circuit is programmable.

3. The apparatus as claimed in claim 1, wherein the word-line input port is selected from the group consisting of a read word-line input port and a write word-line input port.

4. The apparatus as claimed in claim 1, the array of memory cells comprising memory cells having the same layout as the memory cell.

5. The apparatus as claimed in claim 1, the array of memory cells comprising memory cells connected in series.

6. The apparatus as claimed in claim 1, the array of memory cells comprising memory cells connected in parallel.

7. The apparatus as claimed in claim 1, the memory cell comprising a read word-line connected to the voltage boost generator to receive the boosted supply voltage.

8. The apparatus as claimed in claim 7, the array of memory cells comprising memory cells, each having the same layout as the memory cell.

9. The apparatus as claimed in claim 8, wherein the word-line input port is selected from the group consisting of a read word-line input port and a write word-line input port.

10. The apparatus as claimed in claim 9, the clock signal having a clock period, wherein the control circuit delays the reference-latch signal relative to the trigger signal by one clock period.

11. The apparatus as claimed in claim 1, the clock signal having a clock period, wherein the control circuit delays the reference-latch signal relative to the trigger signal by one clock period.

12. A method comprising:
- asserting a trigger signal in response to a clock signal;
- asserting a reference-latch signal delayed relative to the trigger signal;
- providing the trigger signal to a critical path that simulates a read path of a memory cell;
- boosting a supply voltage applied to a word line of the memory cell during a read operation if an output of the critical path is a logical high when the reference latch-signal is a logical high.

13. The method as claimed in claim 12, further comprising: delaying the trigger signal by a delay circuit.

14. The method as claimed in claim 13, further comprising: programming the delay circuit to delay the trigger signal.

15. The method as claimed in claim 12, wherein the critical path comprises an array of memory cells, each having the same layout as the memory cell.

16. The method as claimed in claim 15, wherein the array of memory cells comprises memory cells connected in parallel.

17. The method as claimed in claim 15, wherein the array of memory cells comprises memory cells connected in series.

18. An apparatus comprising:
- a rail having a supply voltage;
- a memory cell coupled to the rail;
- means for boosting the supply voltage to the memory cell;
- means for asserting a trigger signal and a reference-latch signal in response to a clock signal, wherein the reference-latch signal is delayed relative to the trigger signal;
- means for delaying the trigger signal;
- an array of memory cells having a word-line input port coupled to the delay circuit to receive the delayed trigger signal, the array of memory cells to provide a set of read bit-line signals in response to the delayed trigger signal;
- means for latching comprising a reference-latch input port to receive the reference-latch signal, a set of latch input ports to receive the set of read bit-line signals, and an output port to cause the means for boosting the supply voltage to boost the supply voltage to be greater than the supply voltage.

19. The apparatus as claimed in claim 18, wherein means for delaying is programmable.

20. The apparatus as claimed in claim 18, wherein the word-line input port is selected from the group consisting of a read word-line input port and a write word-line input port.

21. The apparatus as claimed in claim 18, the array of memory cells comprising memory cells having the same layout as the memory cell.

22. The apparatus as claimed in claim 18, the array of memory cells comprising memory cells connected in series.

23. The apparatus as claimed in claim 18, the array of memory cells comprising memory cells connected in parallel.

24. The apparatus as claimed in claim 18, the memory cell comprising a read word-line connected to the means for boosting the supply voltage.

25. The apparatus as claimed in claim 24, the array of memory cells comprising memory cells, each having the same layout as the memory cell.

26. The apparatus as claimed in claim 25, wherein the word-line input port is selected from the group consisting of a read word-line input port and a write word-line input port.

27. The apparatus as claimed in claim 26, the clock signal having a clock period, wherein the means for providing the trigger signal and the reference-latch signal, and the means for delaying, delay the reference-latch signal relative to the delayed trigger signal by one clock period.

28. The apparatus as claimed in claim 18, the clock signal having a clock period, wherein the means for providing the trigger signal and the reference-latch signal, and the means for delaying, delay the reference-latch signal relative to the delayed trigger signal by one clock period.

* * * * *